United States Patent
Korenaga et al.

(10) Patent No.: US 6,414,742 B1
(45) Date of Patent: *Jul. 2, 2002

(54) STAGE APPARATUS, AND EXPOSURE APPARATUS AND DEVICE MANUFACTURING METHOD USING THE SAME

(75) Inventors: Nobushige Korenaga, Utsunomiya; Shuichi Yabu, Kawasaki, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,495

(22) Filed: Dec. 11, 1998

(30) Foreign Application Priority Data

Dec. 26, 1997 (JP) .............................. 9-359832

(51) Int. Cl.⁷ .......................... G03B 27/42; H02K 41/00
(52) U.S. Cl. ............................ 355/53; 318/135; 310/12
(58) Field of Search ........................ 355/53; 318/135; 310/12

(56) References Cited

U.S. PATENT DOCUMENTS

| 3,736,880 | A | * | 6/1973 | Ross ........................... 318/687 |
|---|---|---|---|---|
| 4,742,286 | A | * | 5/1988 | Phillips ....................... 318/640 |
| 5,073,912 | A | * | 12/1991 | Kobayashi et al. ........... 378/34 |
| 5,208,497 | A | * | 5/1993 | Ishii et al. ..................... 310/12 |
| 5,260,580 | A | | 11/1993 | Itoh et al. ................. 250/492.2 |
| 5,467,720 | A | * | 11/1995 | Korenaga et al. ............. 108/20 |
| 5,518,550 | A | | 5/1996 | Korenaga et al. ........... 118/729 |
| 5,684,856 | A | * | 11/1997 | Itoh et al. ..................... 378/34 |
| 5,841,250 | A | | 11/1998 | Korenage et al. ........... 318/135 |

FOREIGN PATENT DOCUMENTS

| JP | 3-21894 | 1/1991 |
| JP | 6-163353 | 6/1994 |
| JP | 9-4677 | 1/1997 |

* cited by examiner

Primary Examiner—Russell Adams
Assistant Examiner—Khaled Brown
(74) Attorney, Agent, or Firm—Fitzpatrick, Cella, Harper & Scinto

(57) ABSTRACT

A stage apparatus includes a movable stage, a base supporting the stage on a reference plane, a driving mechanism for driving the stage, and a rotor acting on the stage and producing a moment so as to reduce a reaction force produced along with the movement of the stage. The rotor also reduces the reaction force produced upon movement of the stage by the movement of the base and the rotation of the rotor.

32 Claims, 14 Drawing Sheets

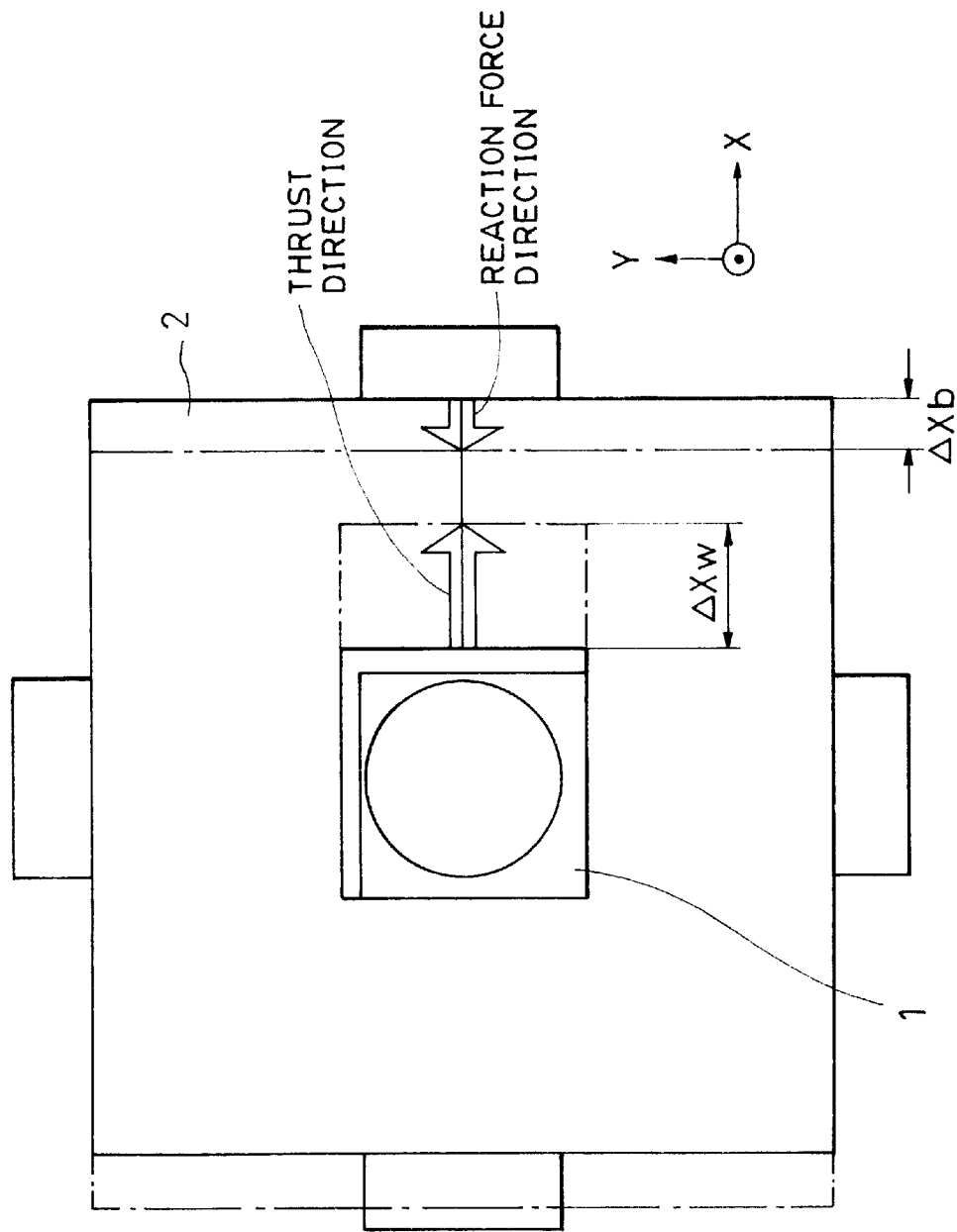

STAGE APPARATUS, AND EXPOSURE APPARATUS AND DEVICE MANUFACTURING METHOD USING THE SAME

BACKGROUND OF THE INVENTION

1. Field of the Invention

The present invention relates to a stage apparatus suitable for accomplishing accurate positioning. More particularly, the invention relates to a stage apparatus used in a semiconductor exposure apparatus for mounting a wafer or the like. The present invention falls under the technical field of an exposure apparatus using such a stage apparatus, and a device manufacturing method for manufacturing a device, such as a semiconductor device, using this exposure apparatus.

2. Description of the Related Art

FIG. 14 schematically illustrates a conventional exposure apparatus.

A main body supporting member 66 is supported via a vibration removing mechanism 62 on a floor 68. A base 61 is secured to the lower half of the main body supporting member 66, and a wafer stage 60 movable in two-dimensional directions (e.g., X and Y directions) is supported on the base 61. A projection optical system 65, an interferometer reference 67 for measuring the position of the wafer stage 60, and a reticle 64, serving as an original, are provided on the upper half of the main body supporting member 66. Further, an illuminating system 63, supplying exposing light, is provided above the reticle 64.

In the aforementioned configuration, the wafer stage 60 receives a wafer supplied by a wafer transport system (not shown), a target position relative to the reticle 64 is converted by an alignment system (not shown) into interferometer data, the wafer stage 60 is moved to a prescribed position by an XY driving mechanism (not shown) with this interferometer data being a target, a reticle image is printed, and the wafer stage 60 is caused to move to the next position. The reticle image is printed onto the entire wafer by repeating these steps.

In order to improve the productivity of the exposure apparatus, it is necessary to reduce the moving time of the stage, and the exposure time. A reduction of the moving time of the stage requires an increase in the acceleration or deceleration upon movement. In order to increase the productivity of post-processing processes, the wafer diameter must be increased, and along with this, the mass of the wafer chuck and that of the wafer stage are only increasing.

Since the driving mechanism of the wafer stage 60 requires a thrust equal to the product (multiplication) of the mass of the wafer stage and the acceleration, a very large thrust produced by the driving mechanism is required under the synergistic effects of the wafer size and the acceleration. As a result, when driving the stage 60, a large reaction force is produced, causing deformation of the exposure apparatus main body, and bringing about a deterioration in the positional accuracy of the exposure and transfer, as well as deflection of the transfer pattern. As a measure against this, a reaction force receiving apparatus (such as that disclosed in Japanese Patent Laid-Open No. 6-163353 and in No. 9-4677) has been proposed.

FIG. 15 schematically illustrates a conventional reaction force receiving apparatus.

In FIG. 15, reference numeral 51 represents a reticle stage carrying a reticle; 52 a base supporting a stage; 53A and 53B anti-vibration springs for supporting the base to reduce vibration from a floor 68; 54 a stand fixed to the floor 68; and 55 a reaction force receiving member. An actuator 56 is formed by a stator 57 fixed to the base and a rotor 58 provided on the reaction force receiving member 55, and actuator 56 can produce a thrust.

FIG. 16 illustrates forces acting on the apparatus shown in FIG. 15.

In the configuration shown in FIG. 16, when the actuator 56 is not operated, a motion of the stage 51 having a mass m by the action of an acceleration a causes a reaction force ma to act on the base 52. The reaction force ma causes deformation of the main body and displacement of the anti-vibration springs 53A and 53B, resulting in fluctuation of the base 52. To prevent such deformation or fluctuation, the reaction force receiving member 55, arranged independently of the base 52, imparts a force f via the actuator 56 to offset the reaction force ma.

In a conventional reaction force receiving apparatus, however, transfer of a reaction force to the surface of the floor 68 is inevitable. As shown in FIG. 16, a plane interval force ma and a moment force M=Lma act on the floor surface, where L is a distance between the position of the center of gravity of the moving stage and the floor surface.

In general, the surface exhibits a large rigidity against the plane interval force. However, because it has a low rigidity against a moment force, floor vibration is caused by the above-mentioned moment force m=Lma. There is, therefore, a problem to be solved in that the floor vibration exerts an adverse effect on operations of the apparatus itself or on peripheral devices.

SUMMARY OF THE INVENTION

An object of the present invention is to reduce a translational force of a reaction and a moment force produced upon accelerating or decelerating the movement of a stage.

The stage apparatus of the invention for achieving the aforementioned object is provided with a movable stage, a base, having a reference plane, supporting the stage, a driving mechanism driving the stage, and a rotor acting on the stage and producing a moment so as to reduce a reaction force produced along with movement of the stage.

An exposure apparatus of the invention is provided with a stage apparatus comprising (i) a movable stage, (ii) a base, having a reference plane, supporting the stage, (iii) a driving mechanism driving the stage and (iv) a rotor acting on the stage and producing a moment so as to reduce a reaction force produced along with movement of the stage, and a light source producing exposure light for exposing a wafer via a reticle.

A device manufacturing method of the invention comprises the steps of providing an exposure apparatus including a stage apparatus comprising (i) a movable stage, (ii) a base, having a reference plane, supporting the stage, (iii) a driving mechanism driving the stage and (iv) a rotor producing a moment so as to reduce a reaction force produced along with movement of the stage, and transferring a pattern formed on a reticle onto a wafer, by the use of the exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a description view of the stage apparatus of the first embodiment of the invention;

DESCRIPTION OF THE PREFERRED EMBODIMENTS

Preferred embodiments of the present invention will now be described in detail in accordance with the accompanying drawings.

<First Embodiment>

Figure 1:
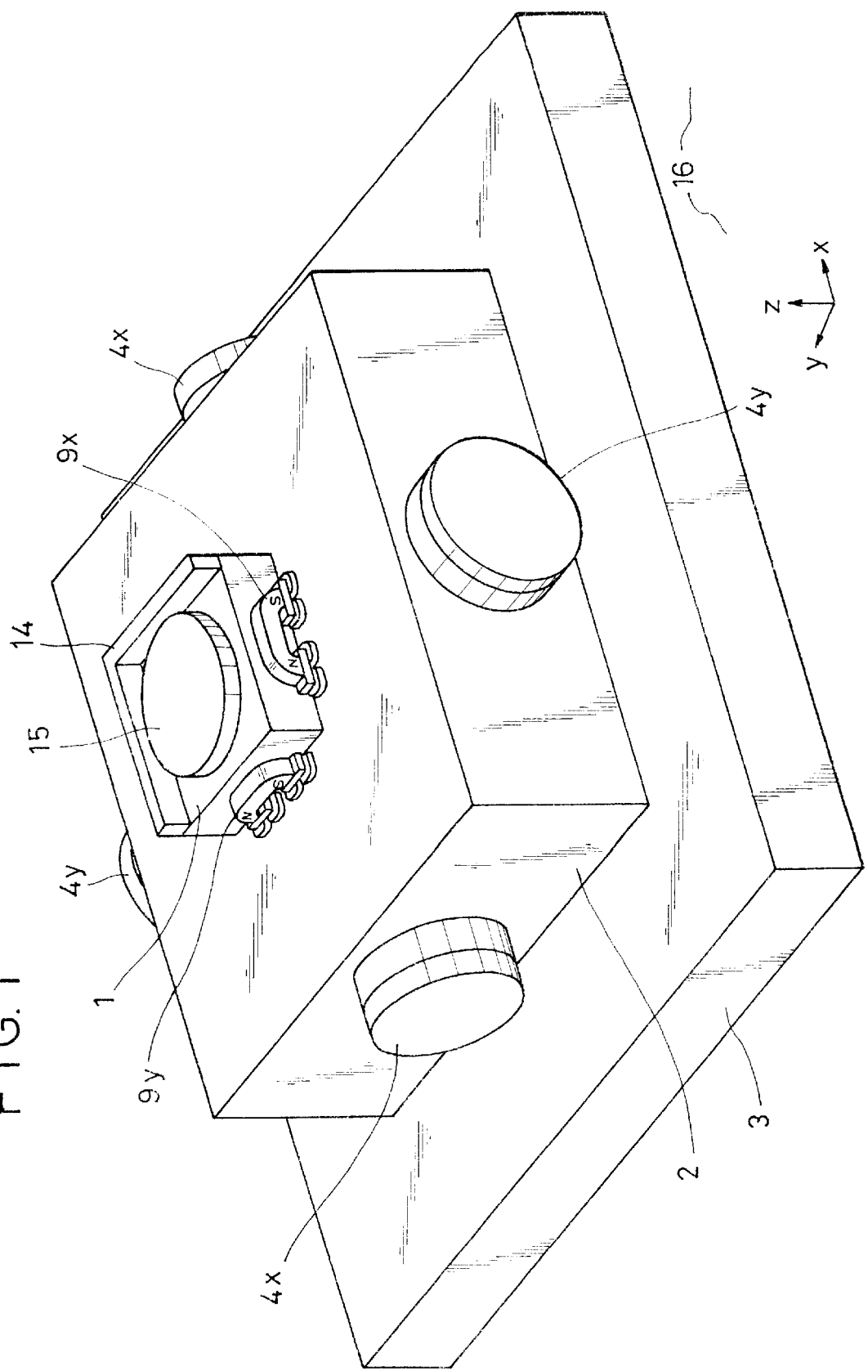
FIG. 1 is a schematic, perspective view of the stage apparatus of a first embodiment of the invention.

FIG. 1 illustrates a schematic perspective view of a stage apparatus of a first embodiment of the present invention. A base 2 is supported on a stand 3 via an air slide (not shown) that is movable along the upper surface of the stand 3. As shown FIG. 1, the coordinates define an XY-axis within a horizontal plane of the upper surface of the base 2 and a Z-axis intersecting the XY-axis at right angles. An actuator is not present between the stand 3 and the base 2, and guiding is accomplished only with the air slide. The base 2 is freely movable and rotatable within the XY-plane.

A rotor 4, rotatable around the normal of each of the four sides of the base 2, is also provided. Another rotor 4, which is rotatable around the Z-axis is provided within the base 2, thus providing five rotors in total. A detailed structure of each rotor 4 is illustrated in FIG. 2C. The rotor with the X-axis as the normal is called ωx rotor 4x, the rotor with the Y-axis as the normal is called ωy rotor 4y, and the rotor with the Z-axis as the normal is called ωz rotor 4z.

Figure 2A:
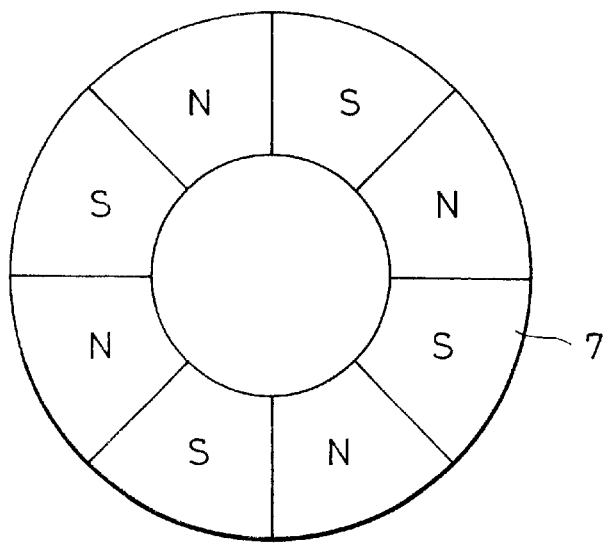
FIGS. 2A through 2C are configuration diagrams of a rotor used in the invention.
Figure 2B:
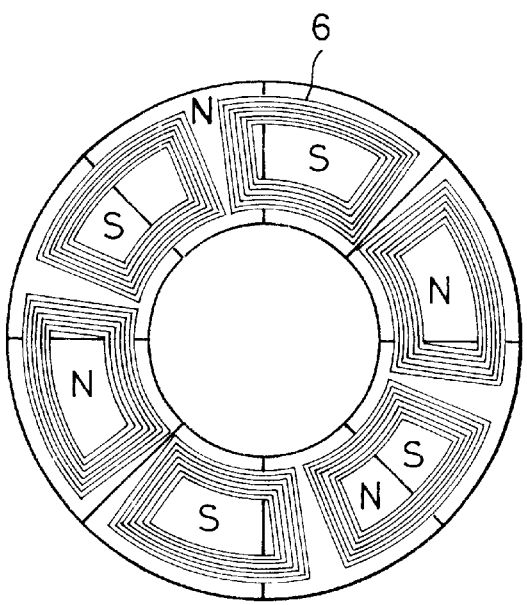
Figure 2C:
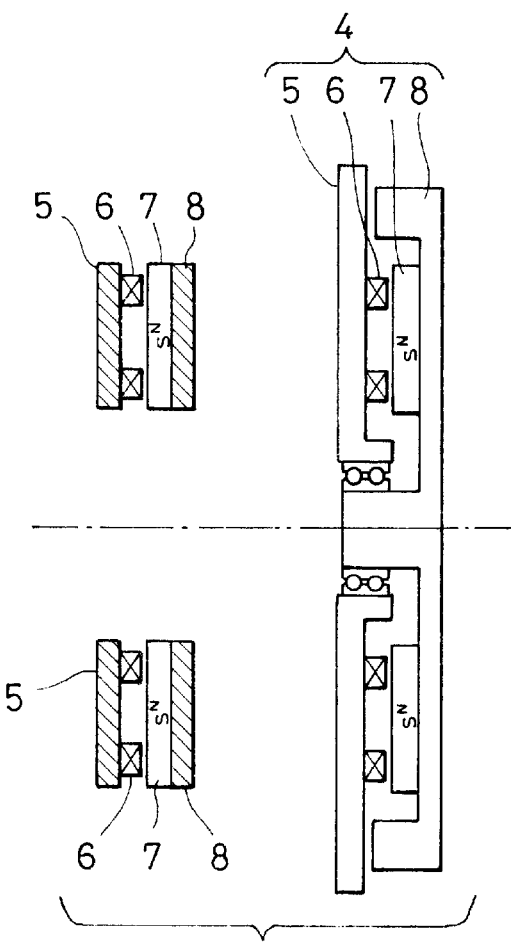
Figure 3A:
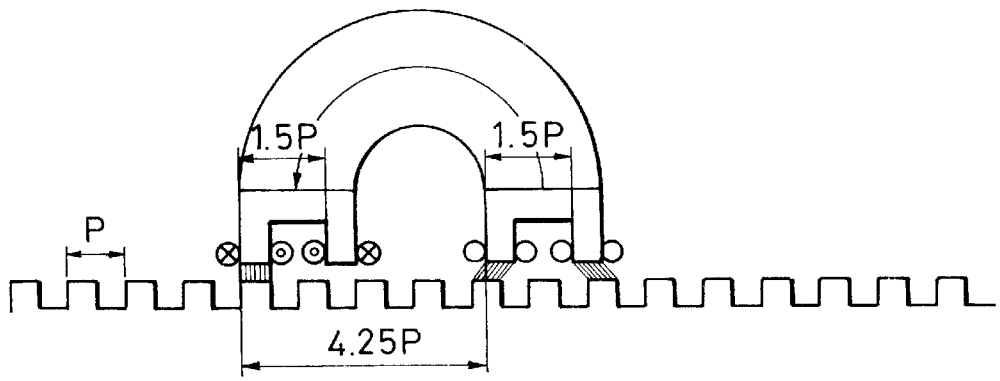
FIGS. 3A through 3D illustrate a driving principle of a pulse motor used in the invention.
Figure 3B:
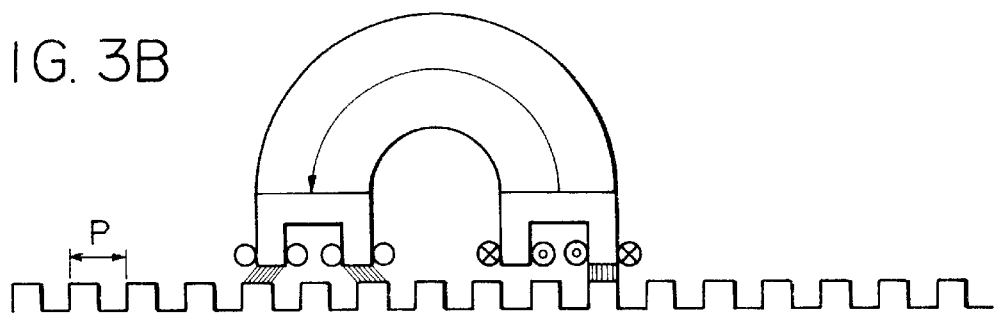
Figure 3C:
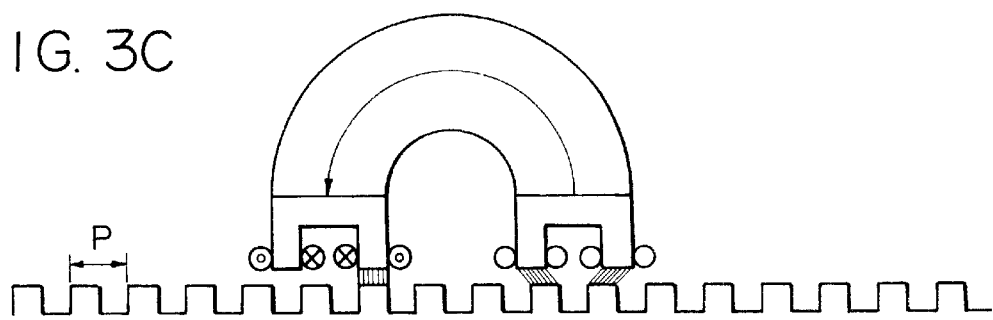
Figure 3D:
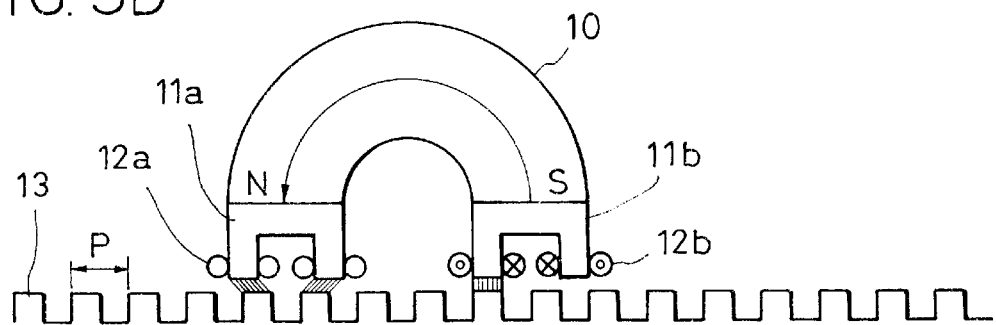

As shown in FIGS. 2A through 2C, the rotor 4 has a fixed-side yoke 5, which is fixed to the base 2; six fan-shaped coils fixed to the fixed-side yoke 5; a movable-side yoke 8 rotatably supported via a bearing with the fixed-side yoke 5; and an electrode magnet 7 provided parallel to a rotating shaft facing a coil fixed to the fixed-side yoke 5 with a fine gap.

The rotors 4 shown in FIGS. 2A through 2C constitute an AC motor having two sets of three-phase coils and an eight-pole magnet. A sensor (not shown) detecting a relative electrical angle of the coil 6 and the magnet 7 is provided therein, and controls current supplied to the three-phase coil in response to the electrical angle.

Referring back to FIG. 1, a wafer stage 1 is provided on the upper surface of the base 2. The wafer stage 1 is movably and rotatably supported via an air slide (not shown) along the upper surface, i.e., the XY-plane of the base 2. The wafer stage 1 has substantially a rectangular parallelepiped shape, and has driving mechanisms 9x and 9y for moving the wafer stage 1 on the front side surfaces thereof. The driving mechanism for moving in the X-direction is referred to as the X-driving mechanism 9x, and the driving mechanism for moving in the Y-direction, as the Y-driving mechanism 9y.

The principle of the driving mechanisms is illustrated in FIGS. 3A through 3D. These Figures show the driving principle of a general linear pulse motor. Each driving mechanism is composed of a permanent magnet 10, a movable tooth 11a, a movable tooth 11b, and four coils 12a through 12d wound around the individual teeth. First, a fixed tooth 13 having a pitch P is provided, on the upper surface of the base 2 in this embodiment. Each of the movable teeth 11a and 11b is composed of a pair of small teeth spaced apart from each other by 1.5 P (i.e., spaced apart by 180° in electrical angle terms, with the pitch P used as a reference). The movable tooth 11a and the movable tooth 11b are connected by the permanent magnet 10, as shown in FIGS. 3A through 3D. The movable tooth 11a, and the movable tooth 11b have a positional shift of 4.25 P (i.e., an electrical angle of 90°). For each of the movable teeth 11a and 11b, one of the coils such as 12a is wound to form a counterphase to the two small teeth, so that one of the two small teeth is magnetized vertically upward, and the other, vertically downward. In this configuration, the coils 12a and 12b, for example, are magnetically excited in the sequence shown in FIGS. 3A through 3D, and the flow of magnetic flux of the permanent magnet is sequentially distributed. The driving mechanism, as a whole, moves in one direction.

FIGS. 3A through 3D show the principle of the motor based on a current variation in four steps. Actually, however, the motor is operated as a synchronous motor by continuously following the four steps with a sinusoidal current waveform to ensure a continuous movement. While FIGS. 3A through 3D illustrate a one-dimensional operation, the fixed teeth provided on the base 2 are not actually comb-shaped, but take a lattice form, thus permitting operations as shown in FIGS. 3A through 3D in the X-direction and the Y-direction. The wafer stage 1, thus, can be driven in a rotating direction around an axis parallel to the Z-direction by driving the two opposite X-driving mechanisms 9x (or Y-driving mechanism) of the wafer stage 1 in reverse directions.

An air jet port (not shown) is provided between the fixed tooth 13 and the respective driving mechanism to balance the drawing force imparted by magnetic fluxes of the permanent magnet and the coil, and the air pressure, so as to form an air slide. To ensure a stable air flow, a recess of the fixed tooth 13 is filled with a resin to achieve a mechanically flat, but magnetically concave/convex surface.

As shown in FIG. 1, a mirror 14 is provided on the wafer stage 1 so as to permit measurement of the distance from an interferometer reference (not shown).

In the aforementioned configuration, wafer stage moving operations are carried out as follows.

FIG. 4 illustrates operations in the case wherein the center of gravity of the wafer stage 1 moves in the X-direction along the center of gravity in the Y-direction of the base 2.

For moving in the X-direction, current is continuously fed to the coil of the X-driving mechanism by the procedure shown in FIGS. 3A through 3D. At this point, the line of action of the resultant force can pass through the center of gravity of the wafer stage 1 by using an appropriate current ratio between the two sides of the X-driving mechanism. No rotating force is, therefore, produced in the wafer stage 1. In contrast, it is possible to control rotation of the wafer stage 1 by sequentially controlling the current ratio of both sides of the X-driving mechanism while detecting the rotational angle with an interferometer.

The reaction force produced along with movement of the wafer stage 1 is transferred to the base 2 under the effect of a driving force also acting on the fixed teeth 13 of the base 2 upon movement of the X-driving mechanism of the wafer stage 1. When the wafer stage 1 has moved in the +X-direction, the reaction force acts on the base 2 in the −X-direction. Since the base 2 is supported by the stand 3 via the air slide, the base 2 moves in the −X-direction under the effect of this reaction force.

Because the center of gravity of the wafer stage 1 moves along the center of gravity in the Y-direction of the base 2 in FIG. 4, the point of action in the Y-direction of the above-mentioned force in the −X-direction is equal to the Y-coordinate of the center of gravity of the base 2. A moment around the Z-axis by the reaction force is, therefore, not produced.

When the wafer stage 1 moves in the X-direction by ΔXw, the base 2 moves in the −X-direction by ΔXb. The ratio of movement of ΔXw to ΔXb is equal to the inverse of the mass ratio of the wafer stage 1 to the base 2.

The translational component of the driving reaction caused by translational movement of the stage 1 is absorbed by the translational movement of the base 2. Accordingly, the translational force is not transferred to the stand 3 or to the floor 16.

Figure 5:
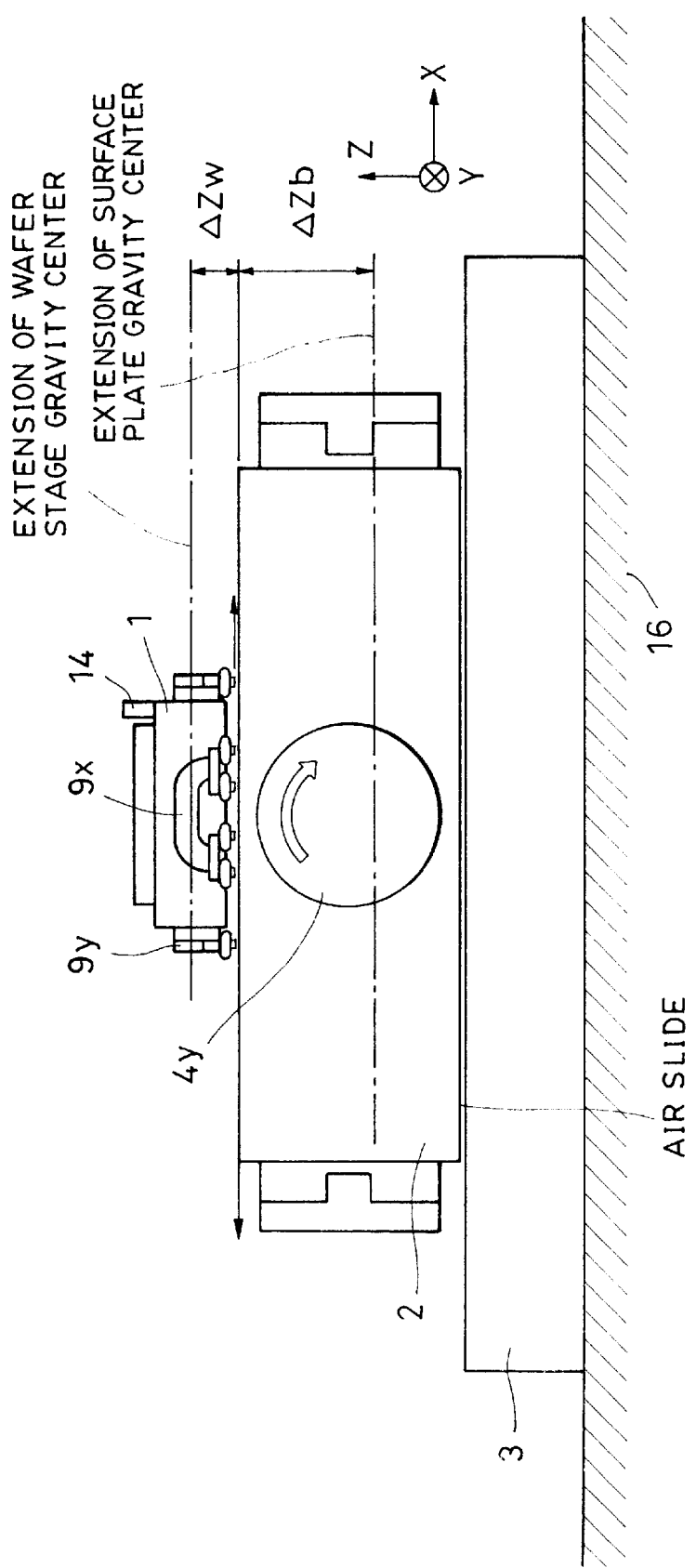
FIG. 5 is another description view of the stage apparatus of the first embodiment of the invention.

Similar operations as viewed in the Y-direction are illustrated in FIG. 5.

The driving force of the wafer stage 1 and the reaction force thereof act substantially on the position of the air slide (not shown) of the wafer stage 1 and the base 2. However, because the Z-coordinates of the centers of gravity of the wafer stage 1 and the base 2 deviate from the air slide, the aforesaid driving force and the reaction force produce a moment around the Y-axis in the wafer stage 1 or the base 2.

It is assumed, as shown in FIG. 5, that the deviation of the Z-coordinates of the center of gravity of the wafer stage 1 from the line of action of the driving force is ΔZw; the deviation of the Z-coordinates of the center of gravity of the base 2 from the line of action of the reaction force is ΔZb; the moment acting from the upper surface of the base 2 on the wafer stage 1 is Mwb; the moment acting from the upper surface of the base 2 on the lower surface of the base 2 is Mbg; and the driving force and reaction acting on the wafer stage 1 are f.

In order to prevent production of an angular acceleration in the wafer stage 1 or the base 2, if a clockwise rotation about the Y-axis is+, then, Mwb−fΔZw=0; and Mbg−fΔZb−Mwb=0.

Solving these formulae results in:

Mbg=f(ΔZb+ΔZw).

The base 2 would, therefore, transfer a moment Mbg to the stand 3 and even to the floor 16. Then, if the AC motor composing the ωy rotor 4y is assumed to have a torque constant Ky, it suffices to control current so that the vector sum of the current of the three-phase coil becomes f(ΔZb+ΔZw)/2Ky. As a result, there is available the following equilibrium formula of the moment regarding the base 2:

Mbg+f(ΔZb+ΔZw)−fΔZb−Mwb=0, which leads to:

Mbg=0, meaning that the transfer of a moment between the base 2 and the stand 3 becomes zero, and the transfer of a moment to the floor 16 also becomes zero.

The case of movement in the X-direction has been shown above. In movement in the Y-direction, however, a moment around the X-axis is produced. It suffices to set this moment off with the ωx rotor 4x. In the case wherein movement occurs simultaneously in the X-direction and in the Y-direction, it suffices to offset each moment with the $\omega_y$ or $\omega_x$ rotor.

Figure 6:
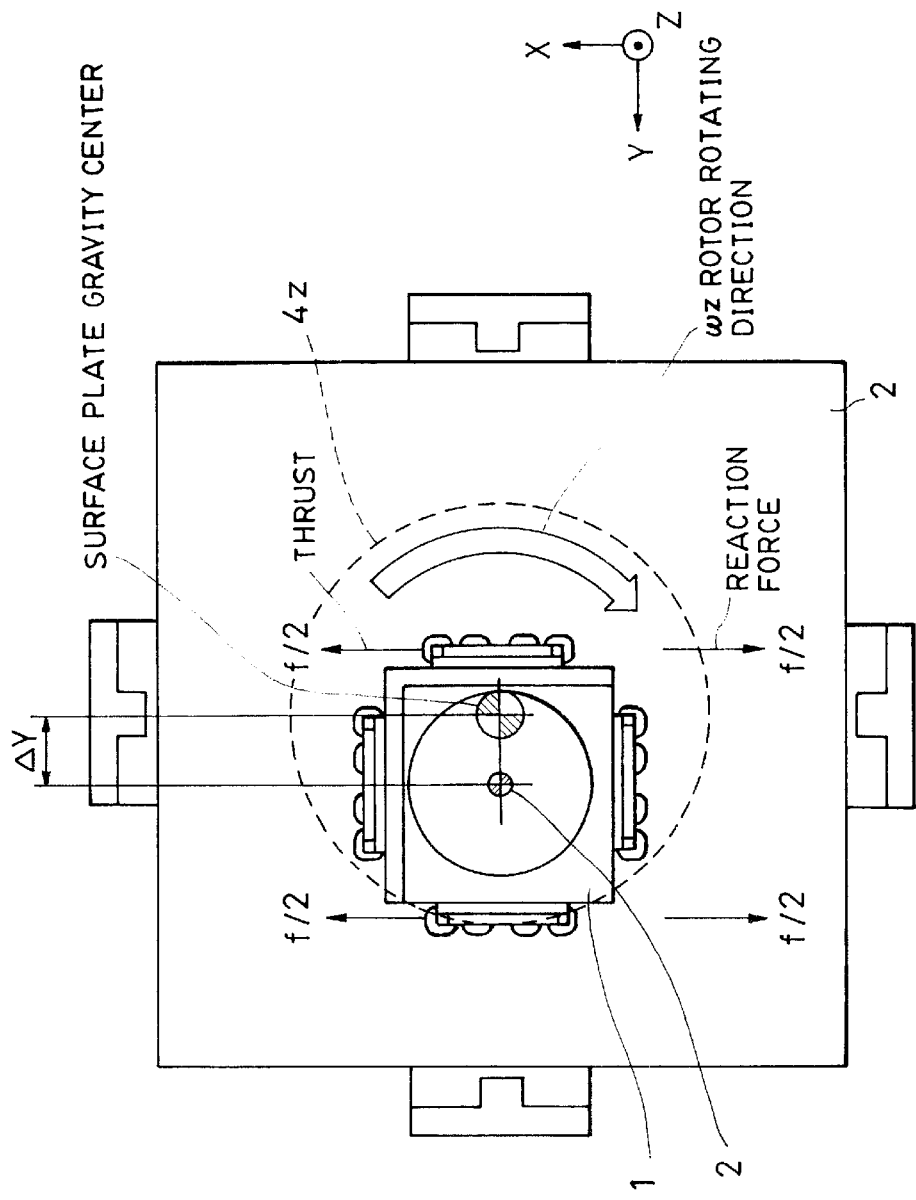
FIG. 6 is a schematic view of the stage apparatus of the first embodiment of the invention.

FIG. 6 illustrates a case in which movement occurs in the X-direction in a state in which the wafer stage 1 and the base 2 shift by ΔY in the Y-direction.

Operations of the wafer stage 1 are similar to those in the aforementioned case. The translational component of the driving reaction is absorbed by the translational movement of the base 2, and the translational force is not transferred to the stand 3 or to the floor 16. However, since the center of gravity of the wafer stage 1 shifts from that of the base 2 by ΔY in the present case, the moment fΔY acts on the base 2, apart from the translational force, under the effect of a reaction.

Because the base 2 and the stand 3 are supported only by the air slide, so as to be capable of translating and rotating, they would rotate with the moment fΔY if no further action is taken. The moment fΔY is, therefore, produced by causing the ωz rotor 4z to rotate as shown in FIG. 6. For this purpose, if the AC motor composing the ωz rotor 4z has a torque constant $K_z$, it suffices to control current so that the vector sum of the current of the three-phase coil becomes $f\Delta Y/K_z$. As a result, the base 2 can retain its posture even upon an occurrence of a moment around the Z-axis under the effect of the driving reaction of the wafer stage 1. The moment around the Y-axis in this case is disposed of in the same manner as in the aforementioned one.

In this embodiment, the pulse motor shown in FIGS. 3A through 3D is employed as a guideless motor for the driving mechanism (9), regarding the XY-directions. The motor is not, however, limited to this, but, for example, an induction motor may be used as a guideless motor. When using an induction motor, the lattice-shaped irregularities of the upper surface of the base 2 become unnecessary. In this case, the surface of the base 2 should preferably have a conductive layer such as aluminum having a small current resistance.

It is, therefore, possible to prevent a reaction force or a moment produced upon movement of the wafer stage 1 from being transferred to the stand 3 by movably supporting the base 2 within a horizontal plane, and providing a rotatable rotor 4 producing a moment on the base 2.

The ratio of the amount of movement of the wafer stage 1 to the base 2, equal to the inverse of the mass ratio, brings about an effect of the stationary center of gravity of the apparatus as a whole.

Also, the use of a guideless motor permits achievement of a lighter weight of the stage apparatus. Further, because the reaction force is transferred directly to the base serving as a stator, thus driving the base, vibration produced in the stand 3 is largely reduced as compared with the conventional apparatus.

<Second Embodiment>

Figure 7A:
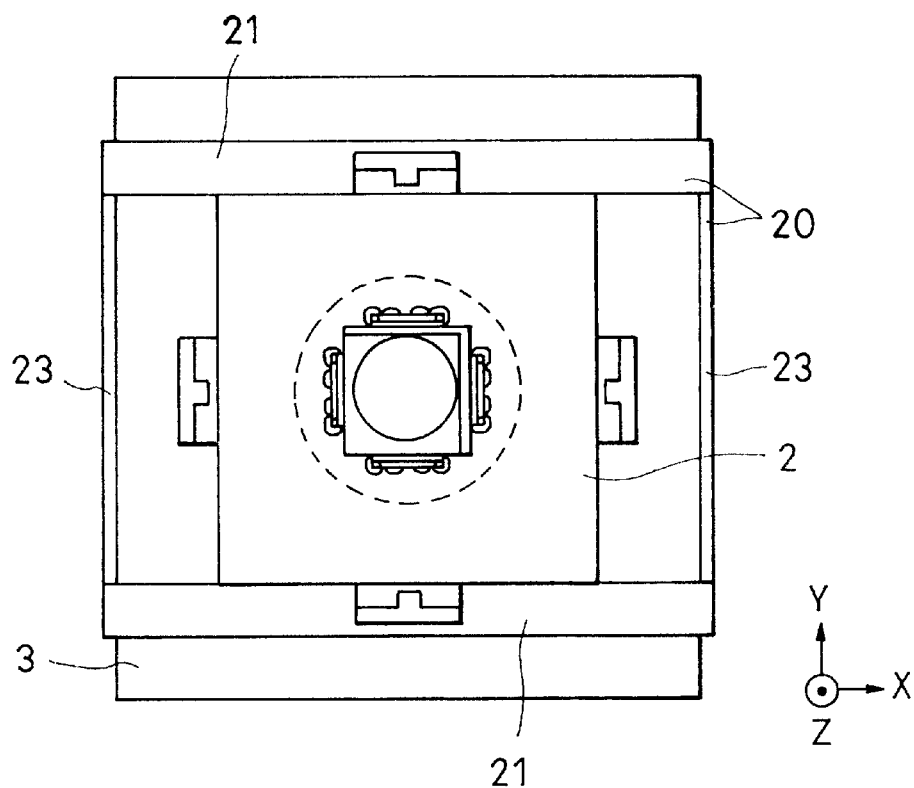
FIGS. 7A and 7B are schematic views of a stage apparatus of a second embodiment of the invention.
Figure 7B:
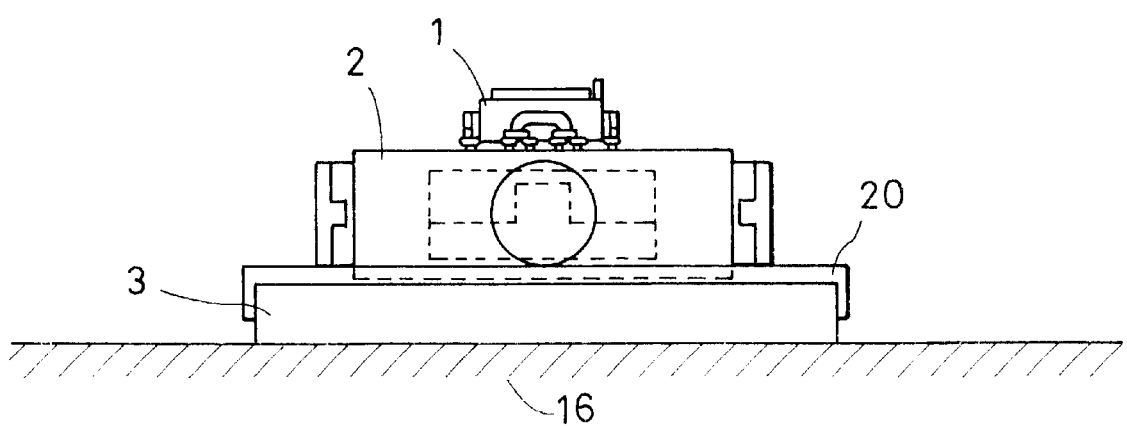

FIGS. 7A and 7B schematically illustrate a stage apparatus of a second embodiment of the invention.

The component members corresponding to those in the aforementioned first embodiment are assigned the same reference numerals, and a description thereof is omitted.

In the second embodiment, a □-shaped (square-shaped) guide frame 20 is provided in addition to the configuration of the first embodiment. The □-shaped guide frame 20 is composed of two X-beams 21 and two Y-beams 23. A Y-direction air slide is formed by the inner sides of the two Y-beams 23 and a side of the stand 3. The □-shaped guide frame 20 is slidably constrained in the Y-direction relative to the stand 3. An X-direction air slide is formed by the inner sides of the two X-beams 21 and a side of the base 2. The base 2 is slidably constrained in the X-direction relative to the □-shaped guide frame 20. As a result, the base 2 is supported so as to be capable of only translating within the XY-plane relative to the stand 3.

Driving operations of the stage in the above-mentioned configuration are the same as those in the first embodiment, providing the same advantages as in the first embodiment, and further, providing an additional advantage of a non-occurrence of rotation of the base 2 around the Z-axis caused by incidental malfunction. Rotation of the base 2 does not occur as a consequence of normal operation, and, therefore, it is not necessary to provide a □-shaped frame. Actually, however, there may occur an unexpected malfunction. Therefore, it is necessary to provide a posture compensating mechanism of the base in a non-powered state. From such a consideration, a rotation constraining mechanism such as a □-shaped guide frame 20 is practically necessary. The rotation constraining mechanism is not, however, limited to a □-shaped frame. Even when such a constraining mechanism is provided, the moment around the Z-axis is offset in the procedure as shown in FIGS. 7A and 7B, so that the reaction force is not transferred to the floor 16.

Because the mechanism for constraining rotation of the base 2 is provided in this embodiment, the rotor 4 producing the moment may be provided, not on the base 2, but on the stand 3 supporting the base 2, to reduce vibration of the stand 3.

<Third Embodiment>

Figure 8:
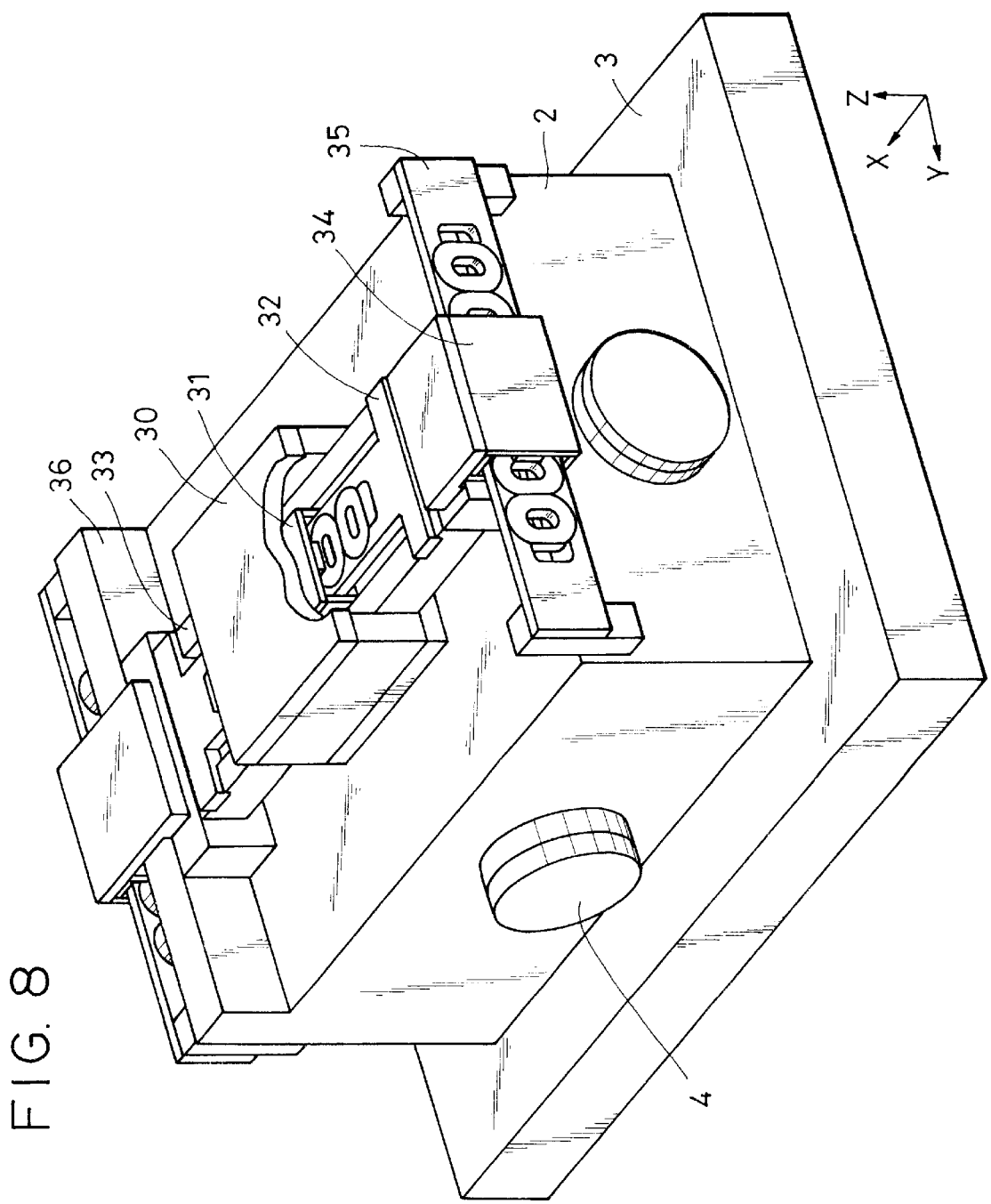
FIG. 8 is a schematic, perspective view of a stage apparatus of a third embodiment of the invention.

FIG. 8 illustrates a third embodiment of a stage apparatus of the invention.

The guideless wafer stage 2 has been provided on the base 3 in the preceding embodiment. The present embodiment covers a case in which an XY-stage 2 having a guide is provided on the base 3. The configuration above the base 3 differs between the preceding and the present embodiments. The component members corresponding to those in the first embodiment are assigned the same reference numerals, and a description thereof is omitted here.

A yaw guide 36 is provided on a side of the upper surface of the stage 2, forming an air slide between the yaw guide 36 and the side surface of a side slider of a Y-stage 33, so as to guide the Y-stage 33 in the Y-direction. The Y-stage 33 is substantially composed of two X-guides and a side slider member, and an air slider is formed between the lower surface of the side slider and the upper surface of the stage 2. As a result, the Y-stage 33 is guided by the yaw guide 36 and the upper surface of the base, and supported slidably in the Y-direction. The X-stage 30 is composed of a ceiling plate, a bottom plate and two side plates. An air slide is formed between the insides of the two side plates of the X-stage 30 and the two X-guides of the Y-stage 33, to guide the X-stage 30 in the X-direction. An air slide is formed between the bottom plate of the X-stage and the upper surface of the stage 2 to constrain the Z-direction position of the X-stage 30. As a result, the X-stage 30 is guided by the upper surface of the stage 2 and the X-guide of the Y-stage, and is supported so as to be capable of translating in the XY-directions along the upper surface of the stage 2.

Two linear motors relative to the Y-direction and a linear motor relative to the X-direction are provided as driving mechanisms of the XY-stages. Each linear motor is composed of a needle (rotor) having a built-in four-pole magnet and a stator comprising a six-phase coil, so that a coil to be driven and a current direction are selected from the six-phase coil in response to the position of the magnet to cause a force to act on the needle. The stator 35 of the Y-linear motor is fixed to the stage 2, and the needle 34 of the Y-linear motor is fixed to the Y-stage 33. The stator 32 of the X-linear motor is fixed to the Y-stage 33, and the needle 31 of the X-linear motor is fixed to the X-stage 30. As a result, the reaction force of the driving force in the X-direction is transferred from the X-stator 32 via the Y-stage 33 and the yaw guide 36 to the stage 2. The reaction force of the driving force in the Y-direction is transferred from the Y-stator 35 to the stage 2. This manner of transfer of the driving reaction force in the stage apparatus of this embodiment is the same as that in the stage apparatus of the preceding embodiment.

The portion of the rotor 4 under the upper surface of the stage 2 has the same configuration as that in the stage apparatus of the preceding embodiment. Operations of the rotor 4 for preventing the driving reaction force A from being transferred to the floor are, therefore, the same as those in the stage apparatus of the preceding embodiment. As a result, the same advantages as those in the preceding stage apparatus can be expected. In the stage apparatus of the preceding embodiment, the driving force of the wafer stage 2 acts on the lower surface of the wafer stage, so that the Z-coordinates of the center of gravity of the wafer stage 2 do not agree with the Z-coordinates of the line of action of the driving force. In the stage apparatus of this embodiment, in contrast, it is possible to make a design in which the Z-coordinates of the line of driving action agree with the Z-coordinates of the centers of gravity of the X-stage 30 and the Y-stage 33 for both the X-linear motor and the Y-linear motor. It is, therefore, possible to bring ΔZw shown in FIG. 5 to zero, and to reduce the rotation moment of the rotor.

In the present embodiment, also, as in the second embodiment, it is desirable to provide a rotation constraining mechanism of the stage 2.

While linear motors are used as driving mechanisms for the XY-directions in this embodiment, the driving mechanism is not limited to this. For example, a more general linear driving mechanism such as a feed screw may be used. Also, a laminated two-step stage may be applied as an XY-stage.

When a mechanism constraining rotation around the Z-axis of the stage is provided, as in the second embodiment, the ωx rotor, the ωy rotor and the ωz rotor may be provided on a portion of the stand or the floor.

<Fourth Embodiment>

Figure 9:
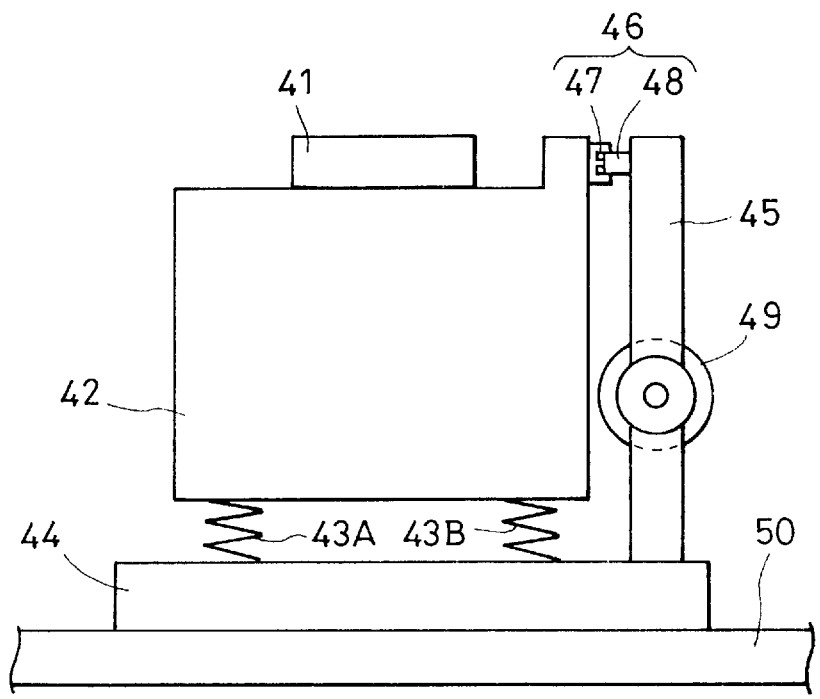
FIG. 9 is a schematic view of a stage apparatus of a fourth embodiment of the invention.

FIG. 9 is a schematic view of a stage apparatus of a fourth embodiment of the invention.

In FIG. 9, reference numeral 41 represents a reticle stage carrying a reticle; 42 a reticle base supporting the reticle stage, the reticle stage 41 being movable on the reticle base 42 by a driving mechanism (not shown), provided on the reticle base 42; 43A and 43B anti-vibration springs for mounting the reticle base 42 and preventing vibration from the floor; 44 a stand fixed to the floor 50; 45 a reaction force receiving member, which is arranged independently of the stage 41, and fixed integrally to the floor 50; 46 an actuator composed of a stator 47 fixed to the base 42 and a needle (rotor) 48 provided in the reaction force receiving member 45, which can produce a thrust; and 49 a rotatable rotor provided on the reaction force receiving member 45, having the same structure as that of the above rotor, and being capable of producing a moment.

Figure 10:
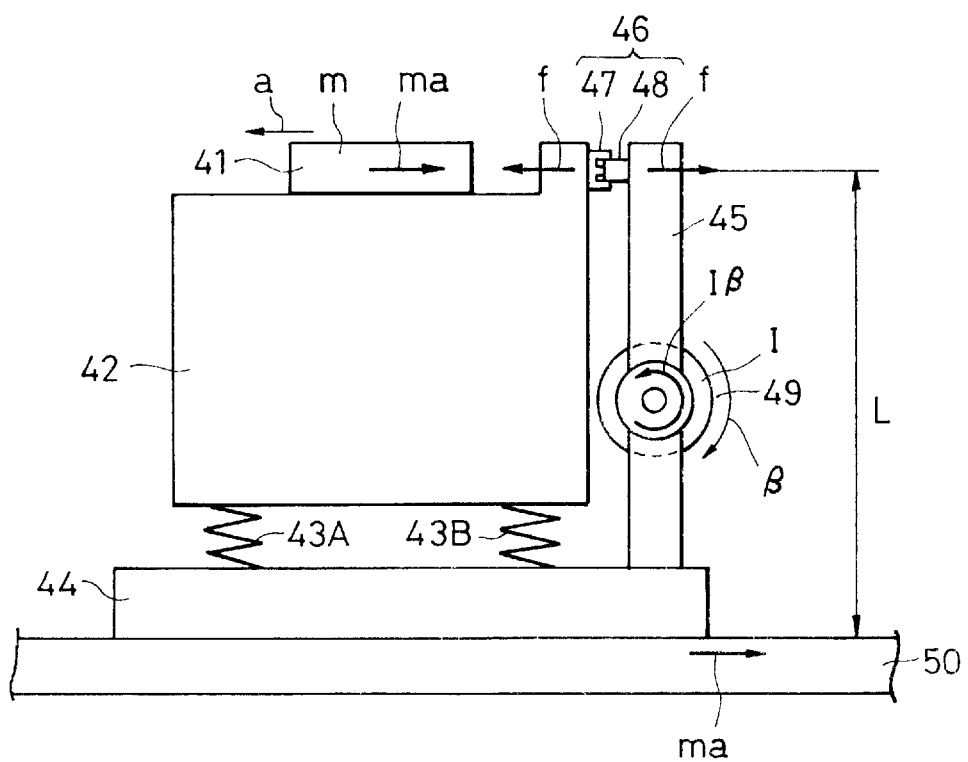
FIG. 10 is a descriptive view of the stage apparatus of the fourth embodiment of the invention.

FIG. 10 illustrates forces acting on the stage apparatus shown in FIG. 9.

In FIG. 10, m is a mass of the stage 41; L is a distance between the position of the center of gravity of the stage 41 and the surface of floor 50; and I is a moment of inertia of the rotor 49.

In the configuration shown in FIG. 10, when the reticle stage 41 is caused to move at an acceleration a, the base 42 receives a reaction force ma from the stage 41. A force f=ma is imparted from the reaction force receiving member 45 to the base 42 via the actuator 46, so as to offset this reaction force. Simultaneously, the rotor 49 is rotated at a rotating acceleration β, and the moment force M=Lma exerted by the reaction force ma on the stand 44 is offset by controlling β so as to achieve Iβ=Lma.

According to the present embodiment, the reaction force receiving member 45 receives a reaction force produced along with the movement of the stage 41, and the reaction force can be reduced by producing a moment force from the rotor 49 provided on the reaction force receiving member 45. It is, therefore, possible to inhibit vibration of the floor 50 produced by the reaction force receiving member 45, and thus, to reduce adverse effects such as disturbance caused by vibration on other devices surrounding the apparatus.

<Fifth Embodiment>

Figure 11:
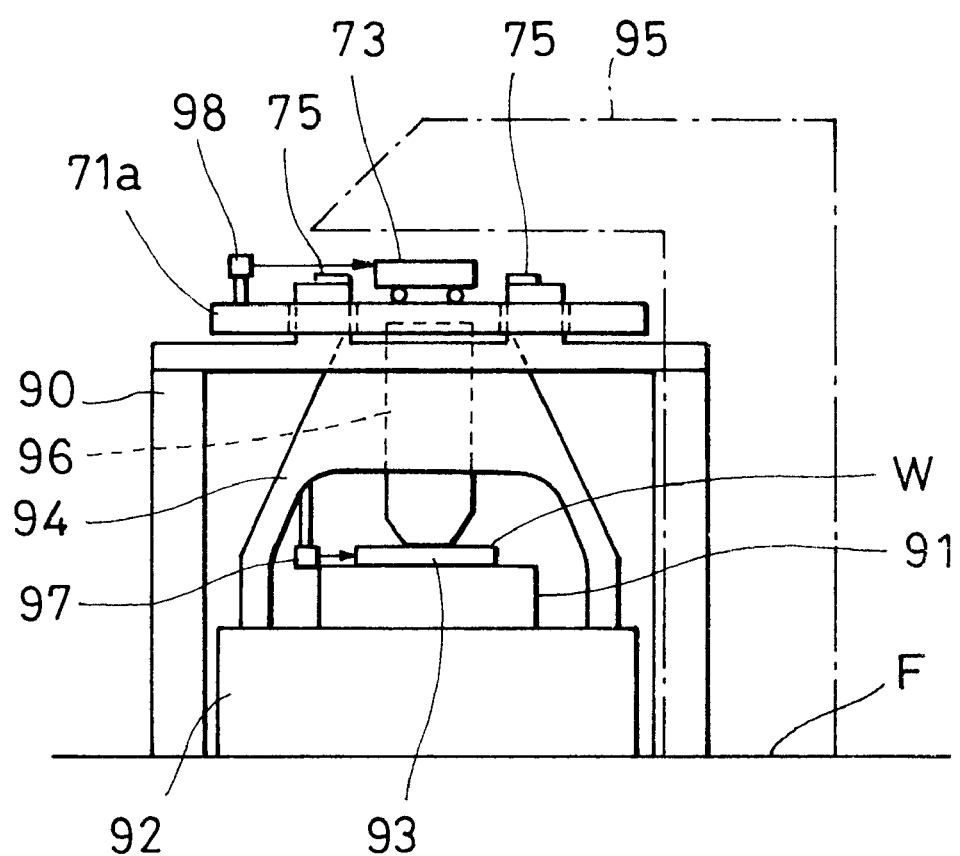
FIG. 11 is a schematic view of an exposure apparatus of a fifth embodiment of the invention.

An embodiment of a scanning type exposure apparatus mounting one of the stage apparatuses of the aforementioned embodiments as a reticle stage or a wafer stage will now be described with reference to FIG. 11.

A reticle base 71a supporting a reticle stage 73 is supported by a supporting frame 90 directly fixed to a floor surface F, separately from a stand 92. Exposing light for exposing a wafer W on a wafer stage 93 via a reticle on the reticle stage 73 is produced from a light source 95, shown by a broken line in FIG. 11.

A frame 94 supports a projection optical system 96 between the reticle stage 73 and the wafer stage 93. Also, in FIG. 11, reference numeral 75 represents a stator of a linear motor for accelerating and decelerating the reticle stage 73. The supporting frame 90 is provided with the above-mentioned rotor (not shown), which offsets a moment produced by the reaction force from the stator of the linear motor. The above-mentioned rotor (not shown) is provided on the base 91 supporting the wafer stage 93, and the base 91 is supported slidably on the stand 92.

The translational component of the reaction force produced upon driving the wafer stage 93 is off-set by the movement of the base 91, and the rotational component thereof is off-set by a moment produced from the rotor.

The wafer stage 93 is scanned in synchronization with the reticle stage 73 by the driving section. During scanning of the reticle stage 73 and the wafer stage 93, the positions of these stages are continuously detected by interferometers 97 and 98, and the results of the detection are fed back to the driving sections of the reticle stage 73 and the wafer stage 93, respectively. It is, therefore, possible to accurately synchronize the scanning starting positions of these stages, and, at the same time, to control the scanning speed in the constant-speed scanning area at a high accuracy.

<Sixth Embodiment>

Figure 12:
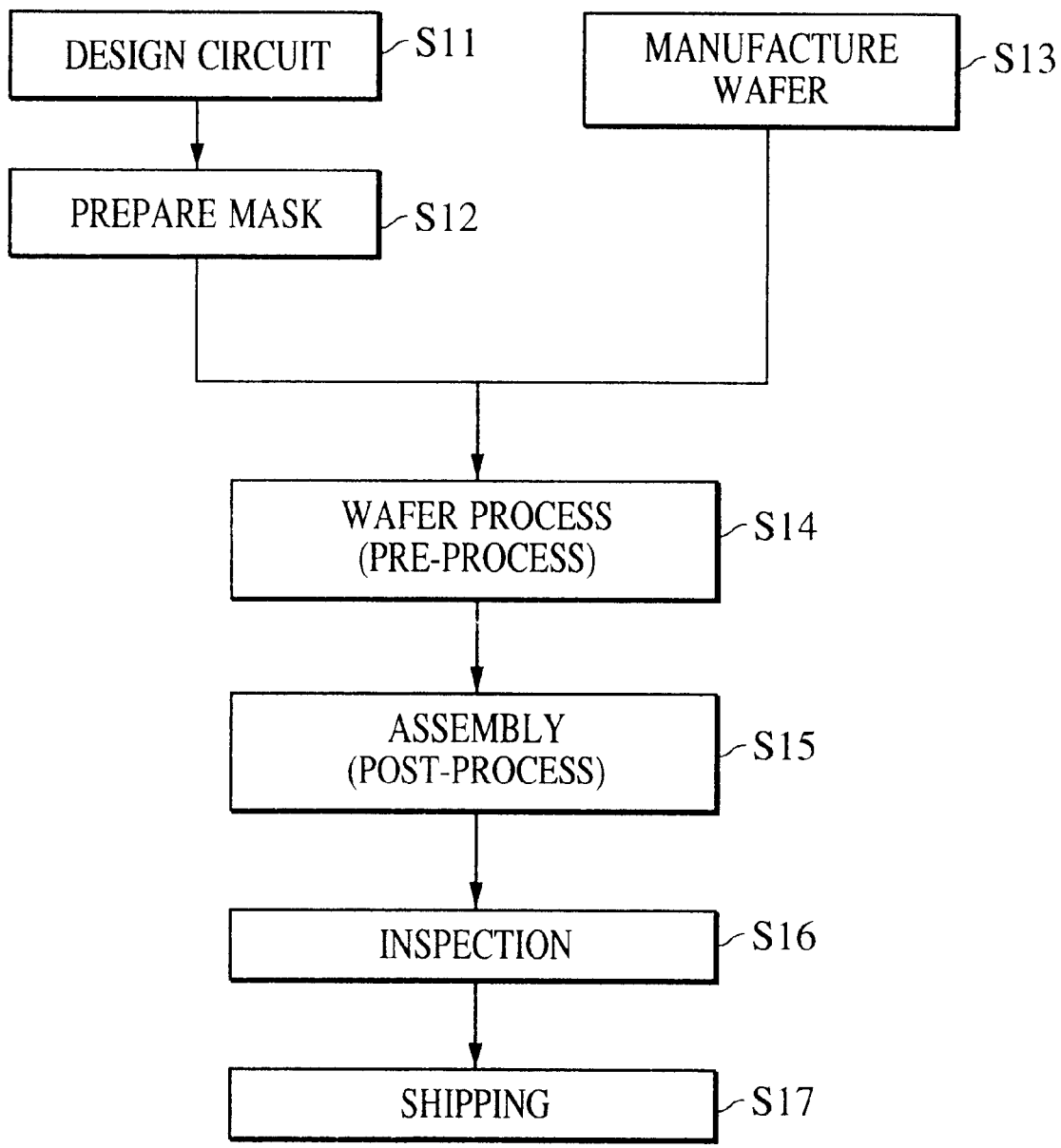
FIG. 12 is a flowchart of a semiconductor device manufacturing method.

An embodiment of a method of manufacturing a semiconductor device utilizing the aforementioned exposure apparatuses will now be described. FIG. 12 illustrates a manufacturing flowchart for manufacturing a semiconductor device (e.g., a semiconductor chip, such as an IC or an LSI, a liquid crystal panel, a CCD, a thin-film magnetic head, or a micro-machine). At step Sll (circuit design), circuits for the semiconductor device are designed. At step S12 (manufacture of a mask), a mask having a circuit pattern thus designed and formed thereon is manufactured. At step S13 (manufacture of a wafer), on the other hand, a wafer serving as a substrate is manufactured by the use of a material such no as silicon. At step S14 (wafer process), called a pre-process, an actual circuit is formed on the wafer by lithography, by the use of the thus manufactured mask and wafer. In the next step, step S15 (assembly), called a post-process, a semiconductor chip is produced by the use of the wafer manufactured at step S14, and includes an assembly step (dicing, bonding), a packaging step (sealing of a chip) and the like. At step S16 (inspection), an operation confirming test, a durability test and other inspections are carried out on the semiconductor device manufactured at step S15. Through these steps, the semiconductor devices are completed and shipped (step S17).

Figure 13:
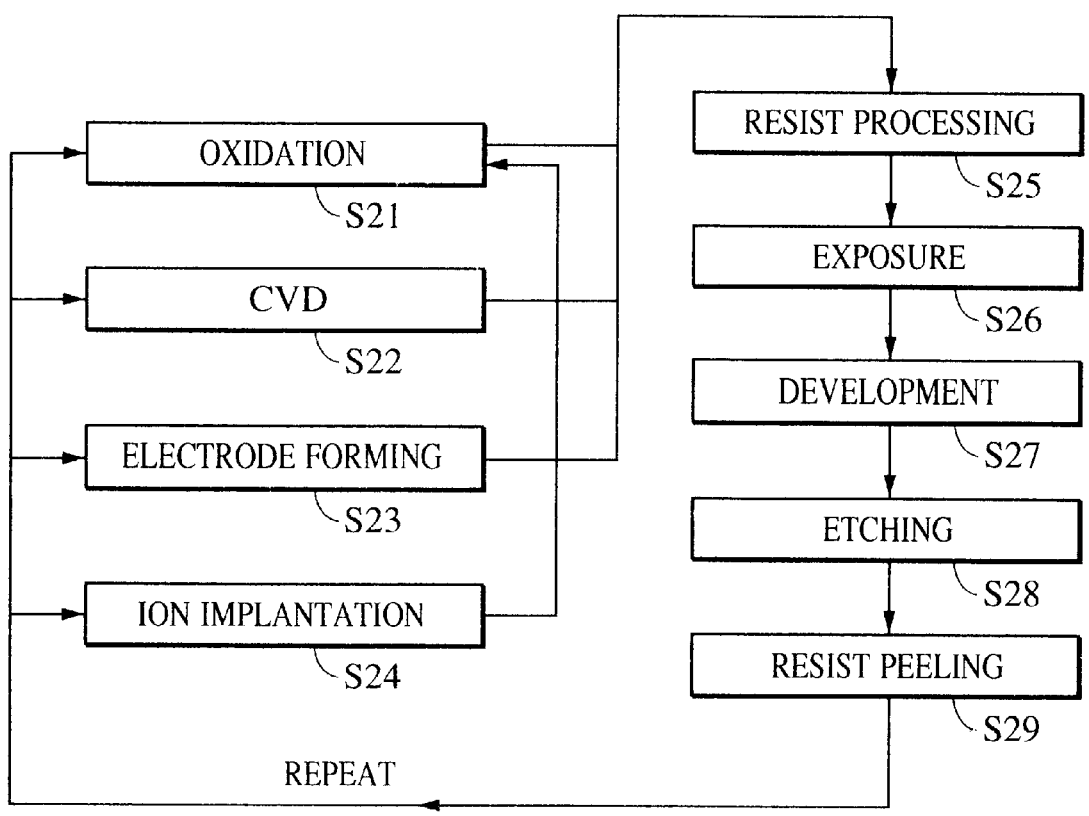
FIG. 13 is a flowchart of a wafer process.
Figure 14:
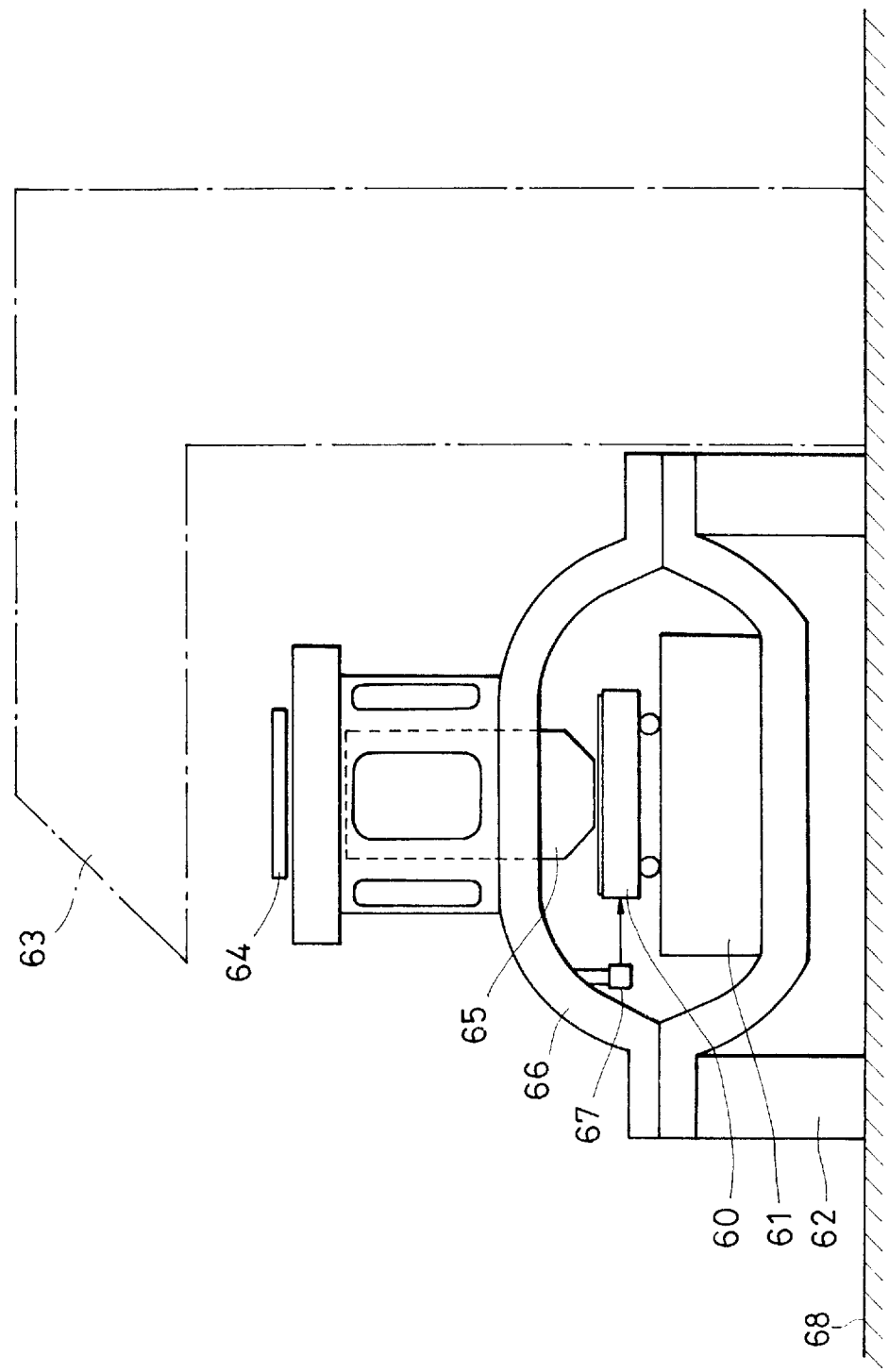
FIG. 14 is a schematic view of a conventional exposure apparatus.
Figure 15:
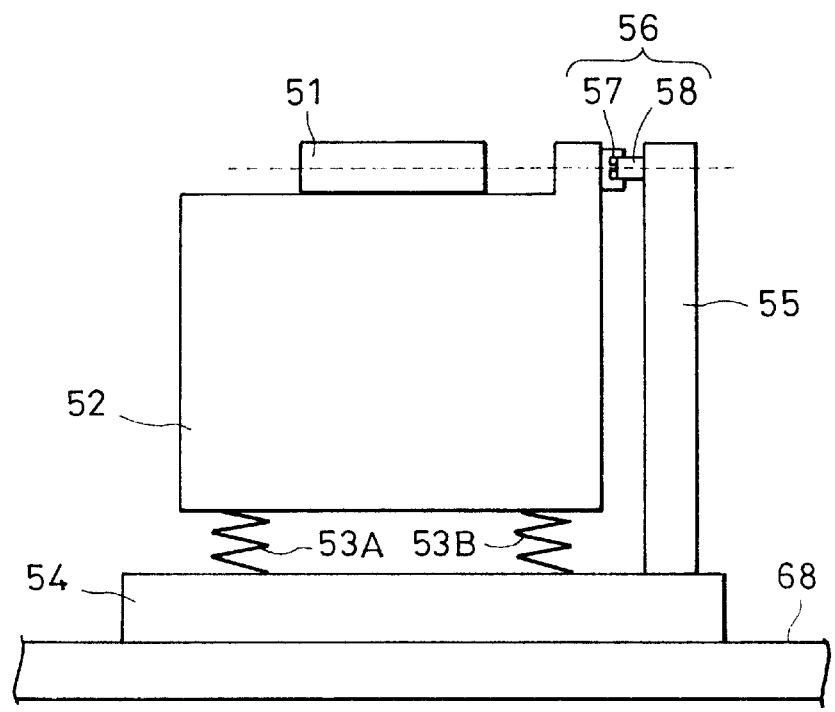
FIG. 15 is a schematic view of a conventional stage apparatus.
Figure 16:
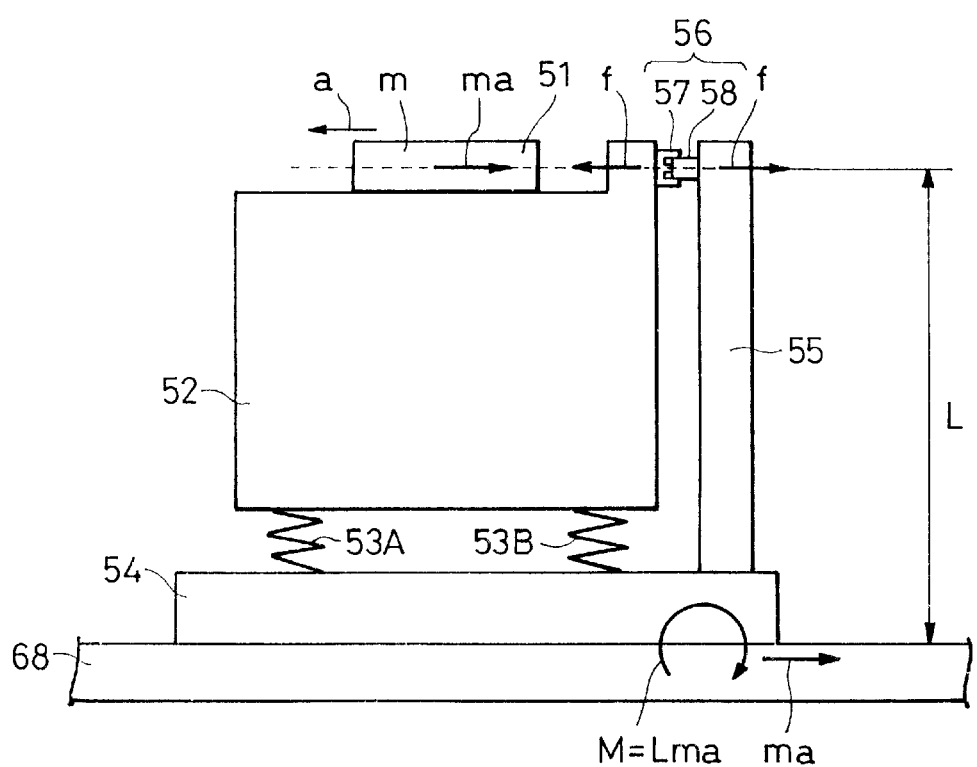
FIG. 16 is a descriptive view of the conventional stage apparatus shown in FIG. 15.

FIG. 13 illustrates a detailed flowchart of the aforementioned wafer process shown in FIG. 12. At step S21 (oxidation), the wafer surface is oxidized. At step S22 (chemical vapor deposition-CVD), an insulating film is formed on the wafer surface. At step S23 (forming electrodes), electrodes are formed on the wafer by vapor deposition. At step S24 (ion implantation), ions are implanted into the wafer. At step S25 (resist processing), a photosensitive agent is coated onto the wafer. At step S26 (exposure), the circuit pattern described above is printed on the wafer and exposed by the exposure apparatus described above. At step S27 (development), the exposed wafer is developed. At step S28 (etching), portions other than the developed resist image are scraped off. At step S29 (resist peeling), any portions of the resist becoming unnecessary after the completion of etching are removed. By repeating these steps, multiple circuit patterns are formed on the wafer. According to the manufacturing method of this embodiment, it is possible to manufacture a semiconductor device having a high degree of integration.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage apparatus comprising:

a movable stage;

a base, having a reference plane, supporting said stage;

a driving mechanism driving said stage to move with respect to the base; and a rotating mechanism attached to said base, said rotating mechanism having a rotating member provided rotatably with respect to said base, said rotating member producing a moment in the base so as to reduce a moment in the base produced by a reaction force produced along with movement of said stage.

2. A stage apparatus according to claim 1, wherein said rotating mechanism is provided on a member receiving the reaction force.

3. A stage apparatus according to claim 2, wherein the member receiving the reaction force is said base supporting said stage.

4. A stage apparatus according to claim 3, wherein said base moves to reduce the reaction force.

5. A stage apparatus according to claim 3, wherein said rotating mechanism produces the moment around an axis at right angles to the reference plane.

6. A stage apparatus according to claim 3, wherein said rotor produces the moment around an axis parallel to the reference plane.

7. A stage apparatus according to claim 4, further comprising a constraining mechanism which constrains motion of said base in the rotating direction within the reference plane.

8. A stage apparatus according to claim 3, wherein said stage is an XY-stage having a guide provided on said base.

9. A stage apparatus according to claim 3, wherein said driving mechanism is a guideless motor fixed to said stage.

10. A stage apparatus according to claim 9, wherein said guideless motor is a pulse motor.

11. A stage apparatus according to claim 9, wherein said guideless motor is an induction motor.

12. A stage apparatus according to claim 2, wherein the member receiving the reaction force is a reaction force receiving mechanism arranged independently of said stage.

13. A stage apparatus according to claim 12, wherein the reaction force receiving mechanism includes a member integrally fixed to a floor.

14. An exposure apparatus comprising:

a stage apparatus comprising (i) a movable stage, (ii) a base, having a reference plane, supporting said stage, (iii) a driving mechanism driving said stage to move with respect to the base and (iv) a rotating mechanism attached to said base, said rotating mechanism having a rotating member provided rotatably with respect to said base, said rotating member producing a moment in the base so as to reduce a moment in the base produced by a reaction force produced along with movement of said state; and a light source producing exposure light for exposing a wafer via a reticle.

15. A device manufacturing method comprising:

a step of providing an exposure apparatus including a stage apparatus comprising (i) a movable stage, (ii) a base, having a reference plane, supporting the stage, (iii) a driving mechanism driving the stage to move with respect to the base and (iv) a rotating mechanism attached to said base, said rotating mechanism having a rotating member provided rotatably with respect to said base, said rotating member producing a moment in the base so as to reduce a moment in the base produced by a reaction force produced along with movement of the said stage; and a step of transferring a pattern formed on a reticle onto a wafer, by the use of the exposure apparatus.

16. A method according to claim 15, further comprising:

a step of coating a photosensitive material onto the wafer; and a step of developing the photosensitized wafer.

17. A stage apparatus comprising:

a movable stage;

a base, having a reference plane, supporting said stage;

a driving mechanism driving said stage to move with respect to the base; and a moment producer attached to the base for producing a moment in the base, wherein said moment producer produces the moment around an axis parallel to the reference plane.

18. A stage apparatus according to claim 17, wherein said moment producer has a movable member which is rotatable with respect to said base.

19. A stage apparatus according to claim 17, wherein said moment producer produces the moment so as to reduce a moment produced in said base by a reaction force produced along with movement of said stage.

20. A stage apparatus according to claim 17, wherein said base moves to reduce a reaction force produced along with movement of said stage.

21. A stage apparatus according to claim 17, wherein said stage is an XY-stage.

22. A stage apparatus according to claim 17, wherein said driving mechanism is a guideless motor.

23. A stage apparatus comprising:

a movable stage;

a base, having a reference plane, supporting said stage;

a guideless motor driving said stage to move with respect to said base; and a moment producer attached to the base for producing a moment in said base.

24. A stage apparatus according to claim 23, wherein said moment producer produces the moment around an axis parallel to the reference plane.

25. A stage apparatus according to claim 23, wherein said moment producer has a movable member which is rotatable with respect to said base.

26. A stage apparatus according to claim 23, wherein said moment producer produces the moment so as to reduce a moment produced in said base by a reaction force produced along with movement of said stage.

27. A stage apparatus according to claim 23, wherein said base moves to reduce a reaction force produced along with movement of said stage.

28. A stage apparatus according to claim 23, wherein said stage is an XY-stage.

29. An exposure apparatus comprising:

a stage apparatus comprising (i) a movable stage, (ii) a base, having a reference plane, supporting said stage, (iii) a driving mechanism driving said stage to move with respect to the base and (iv) a moment producer attached to the base for producing a moment in the base, wherein said moment producer produces the moment around an axis parallel to the reference plane; and a light source producing exposure light for exposing a wafer via a reticle.

30. A device manufacturing method comprising:

a step of providing an exposure apparatus including a stage apparatus comprising (i) a movable stage, (ii) a base, having a reference plane, supporting the stage, (iii) a driving mechanism driving the stage to move with respect to the base, and (iv) a moment producer attached to the base for producing a moment in the base, wherein the moment producer produces the moment around an axis parallel to the reference plane; and a step of transferring a pattern formed on a reticle onto a wafer, by use of the exposure apparatus.

31. An exposure apparatus comprising:

a stage apparatus comprising (i) a movable stage, (ii) a base, having a reference plane, supporting said stage, (iii) a guideless motor driving said stage to move with respect to the base and (iv) a moment producer attached to the base for producing a moment in the base; and a light source producing exposure light for exposing a wafer via a reticle.

32. A device manufacturing method comprising:

a step of providing an exposure apparatus including a stage apparatus comprising (i) a movable stage, (ii) a base, having a reference plane, supporting the stage, (iii) a guideless motor driving the stage to move with respect to the base and (iv) a moment producer attached to the base for producing a moment in the base; and a step of transferring a pattern formed on a reticle onto a wafer, by use of the exposure apparatus.

* * * * *

UNITED STATES PATENT AND TRADEMARK OFFICE
CERTIFICATE OF CORRECTION

PATENT NO. : 6,414,742 B1
DATED : July 2, 2002
INVENTOR(S) : Nobushige Korenaga et al.

It is certified that error appears in the above-identified patent and that said Letters Patent is hereby corrected as shown below:

<u>Title page,</u>
Item [56], References Cited, "11/1998 Korenage et al." should read -- 11/1998 Korenaga et al. --.

<u>Column 6,</u>
Line 7, "(y" should read -- ωy --.

<u>Column 8,</u>
Line 36, "A" should be deleted.

<u>Column 9,</u>
Line 28, "exerted-by" should read -- exerted by --.

<u>Column 10,</u>
Line 20, "no" should be deleted.

Signed and Sealed this

Tenth Day of December, 2002

JAMES E. ROGAN
*Director of the United States Patent and Trademark Office*